(12) United States Patent
Marumoto

(10) Patent No.: US 10,707,098 B2
(45) Date of Patent: Jul. 7, 2020

(54) SUBSTRATE PROCESSING APPARATUS, SUBSTRATE PROCESSING METHOD AND MEMORY MEDIUM

(71) Applicant: TOKYO ELECTRON LIMITED, Minato-ku (JP)

(72) Inventor: Hiroshi Marumoto, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 268 days.

(21) Appl. No.: 15/459,707

(22) Filed: Mar. 15, 2017

(65) Prior Publication Data
US 2017/0278725 A1    Sep. 28, 2017

(30) Foreign Application Priority Data

Mar. 24, 2016   (JP) .................................. 2016-060327

(51) Int. Cl.
F26B 3/00    (2006.01)
H01L 21/67   (2006.01)
H01L 21/02   (2006.01)

(52) U.S. Cl.
CPC .. H01L 21/67034 (2013.01); H01L 21/02054 (2013.01); H01L 21/67028 (2013.01)

(58) Field of Classification Search
CPC ...... F26B 5/00; F26B 5/005; H01L 21/67017; H01L 21/67034; H01L 21/67028; H01L 21/02054; H01L 21/67051
USPC ......... 34/329, 330, 312, 313, 314, 317, 337, 34/339, 340, 341, 342, 357, 358
See application file for complete search history.

(56) References Cited

U.S. PATENT DOCUMENTS

| 7,806,989 B2 | 10/2010 | Sekiguchi et al. |
| 2008/0093340 A1* | 4/2008 | Nakamori ......... H01L 21/02019 216/57 |
| 2009/0250079 A1* | 10/2009 | Yoshihara ............... B08B 3/024 134/4 |
| 2011/0289795 A1* | 12/2011 | Ishibashi ........... H01L 21/02074 34/467 |

(Continued)

FOREIGN PATENT DOCUMENTS

| JP | 2007-036180 A | 2/2007 |
| JP | 2012-222237 A | 11/2012 |

(Continued)

*Primary Examiner* — John P McCormack
(74) *Attorney, Agent, or Firm* — Oblon, McClelland, Maier & Neustadt, L.L.P.

(57) ABSTRACT

A substrate processing apparatus includes a substrate holding device, a rotation mechanism, a drying liquid supply nozzle, a movement mechanism, a flow rate control mechanism, and a control device including circuitry which controls one or more of the rotation mechanism, movement mechanism and flow rate control mechanism such that the drying liquid forms a drying liquid flow line having distance (L) equal to or less than preset upper limit distance (M), where when a liquid contact point is position at which the drying liquid discharged from the nozzle reaches the substrate, the flow line is formed when the liquid contact point is moved from a center portion of the substrate toward a peripheral edge portion of the substrate, and the distance (L) of the flow line is measured from center of the liquid contact point to an edge of the flow line on a rotation center side of the substrate.

20 Claims, 11 Drawing Sheets

(56) References Cited

U.S. PATENT DOCUMENTS

| | | | | |
|---|---|---|---|---|
| 2011/0315169 A1* | 12/2011 | Minami | ............ | H01L 21/67028 |
| | | | | 134/30 |
| 2014/0093644 A1* | 4/2014 | Fujii | ...................... | B05D 1/005 |
| | | | | 427/240 |
| 2015/0083167 A1* | 3/2015 | Yoshizumi | ........ | H01L 21/67028 |
| | | | | 134/26 |

FOREIGN PATENT DOCUMENTS

| JP | 2015-041672 A | 3/2015 |
|---|---|---|
| JP | 2015-204427 A | 11/2015 |

\* cited by examiner

Radial Direction Distance [mm]

Radial Direction Distance [mm]

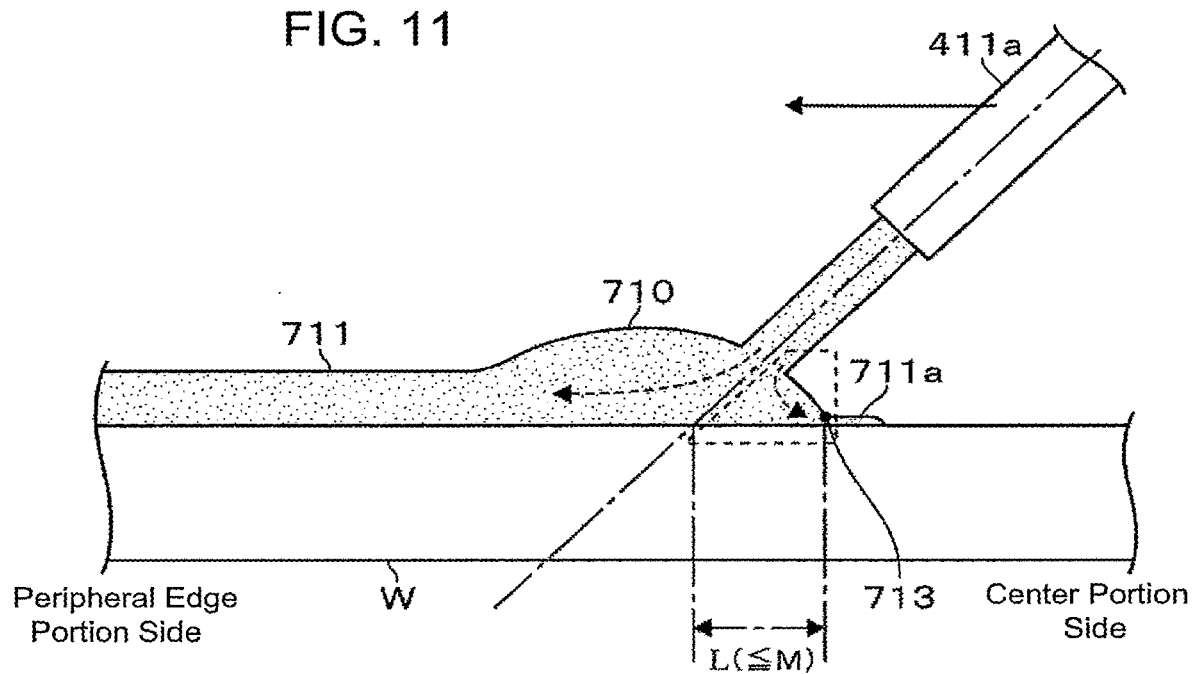

SUBSTRATE PROCESSING APPARATUS, SUBSTRATE PROCESSING METHOD AND MEMORY MEDIUM

CROSS-REFERENCE TO RELATED APPLICATIONS

The present application is based upon and claims the benefit of priority to Japanese Patent Application No. 2016-060327, filed Mar. 24, 2016, the entire contents of which are incorporated herein by reference.

BACKGROUND OF THE INVENTION

Field of the Invention

The present invention relates to a technique for drying a substrate using a drying liquid after processing using a processing liquid is performed.

Description of Background Art

Japanese Patent Laid-Open Publication No. 2007-36180 describes that a substrate is dried by sweeping away a liquid film on an upper surface of the substrate by moving a supply position of a second fluid supplied to the substrate, which is rotating, from a center side toward a peripheral edge portion side of the substrate. The entire contents of this publication are incorporated herein by reference.

SUMMARY OF THE INVENTION

According to one aspect of the present invention, a substrate processing apparatus includes a substrate holding device which holds a substrate, a rotation mechanism which rotates the substrate held by the substrate holding device, a drying liquid supply nozzle which supplies a drying liquid that dries the substrate to a surface of the substrate rotating after processed with a processing liquid, a movement mechanism which moves the substrate held by the substrate holding device and the drying liquid supply nozzle relative to each other, a flow rate control mechanism which controls a supply flow rate of the drying liquid supplied from the drying liquid supply nozzle, and a control device including circuitry which controls one or more of the rotation mechanism, the movement mechanism and the flow rate control mechanism such that the drying liquid forms a drying liquid flow line having a distance (L) equal to or less than a preset upper limit distance (M), where when a liquid contact point is a position at which the drying liquid discharged from the drying liquid supply nozzle reaches the substrate, the drying liquid flow line is formed when the liquid contact point is moved from a center portion of the substrate toward an peripheral edge portion of the substrate, and the distance (L) of the drying liquid flow line is measured from a center of the liquid contact point to an edge of the drying liquid flow line on a rotation center side of the substrate.

According to another aspect of the present invention, a substrate processing apparatus includes a substrate holding device which holds a substrate, a rotation mechanism which rotates the substrate held by the substrate holding device, a drying liquid supply nozzle which supplies a drying liquid that dries the substrate to a surface of the substrate rotating after processed with a processing liquid, a movement mechanism which moves the substrate held by the substrate holding device and the drying liquid supply nozzle relative to each other, and a control device including circuitry which controls the rotation mechanism such that the rotation mechanism varies a number of rotations per unit time for the substrate and that a centrifugal acceleration acting on the drying liquid at a liquid contact point becomes constant along a movement direction of the liquid contact point when the liquid contact point is moved from a center portion of the substrate toward an peripheral edge portion of the substrate, where the liquid contact point is a position at which the drying liquid discharged from the drying liquid supply nozzle reaches the substrate.

According to yet another aspect of the present invention, a substrate processing method includes supplying a drying liquid to a surface of a substrate rotating after processed with a processing liquid such that the processing liquid is removed and the substrate is dried. The supplying of the drying liquid includes moving a liquid contact point from a center portion of the substrate toward an peripheral edge portion of the substrate, and setting a distance (L) of a drying liquid flow line equal to or less than a preset upper limit distance (M), where the liquid contact point is a position at which the drying liquid discharged from the drying liquid supply nozzle reaches the substrate, the drying liquid flow line is formed when the liquid contact point is moved from the center portion of the substrate toward the peripheral edge portion of the substrate, and the distance (L) of the drying liquid flow line is measured from a center of the liquid contact point to an edge of the drying liquid flow line on a rotation center side of the substrate.

According to still another aspect of the present invention, a substrate processing method includes supplying a drying liquid to a surface of a substrate rotating after processed with a processing liquid such that the processing liquid is removed and the substrate is dried. The supplying of the drying liquid includes moving a liquid contact point from a center portion of the substrate toward an peripheral edge portion of the substrate, and varying a number of rotations per unit time for the substrate such that a centrifugal acceleration acting on the drying liquid at the liquid contact point, excluding the center portion of the substrate, becomes constant along a movement direction of the liquid contact point, where the liquid contact point is a position at which the drying liquid discharged from the drying liquid supply nozzle reaches the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 11 is a schematic view from a lateral side of a vicinity of a liquid contact point of IPA discharged from an IPA nozzle according to a third embodiment.

DETAILED DESCRIPTION OF THE EMBODIMENTS

Figure 1:
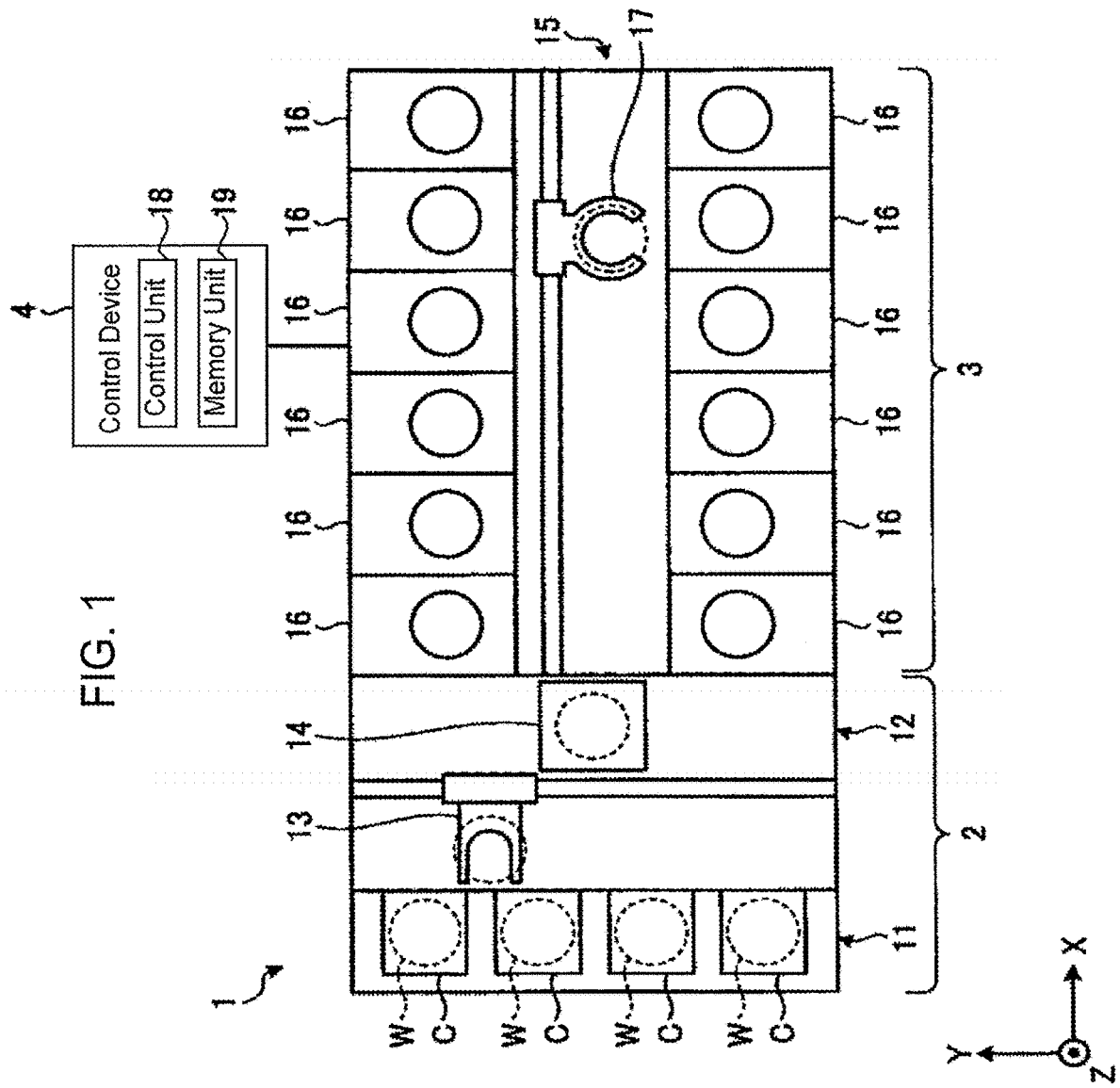
FIG. 1 is a plan view illustrating an outline of a substrate processing system having a processing unit according to an embodiment of the present invention.

The embodiments will now be described with reference to the accompanying drawings, wherein like reference numerals designate corresponding or identical elements throughout the various drawings.

FIG. 1 is a view schematically showing the structure of a substrate processing system according to an embodiment of the present invention. In the following, X, Y and Z axes intersecting each other at right angles are specified to clarify positional relationships, and a positive direction of the Z axis is set as the vertically upward direction. As shown in FIG. 1, substrate processing system 1 is provided with loading station 2 and processing station 3. Loading station 2 and processing station 3 are positioned to be adjacent to each other.

Loading station 2 includes carrier mounting zone 11 and transport zone 12. Multiple carriers (C), which horizontally accommodate multiple substrates—semiconductor wafers (hereinafter wafers (W)) in the present embodiment—are mounted in carrier mounting zone 11.

Transport zone 12 is positioned adjacent to carrier mounting zone 11, and is provided with substrate transport apparatus 13 and delivery table 14. Substrate transport apparatus 13 has a wafer holding mechanism for holding a wafer (W). Substrate transport apparatus 13 is capable of moving horizontally and vertically as well as rotating around the vertical axis, and transports a wafer (W) between a carrier (C) and delivery table 14 using the wafer holding mechanism.

Processing station 3 is positioned adjacent to transport zone 12. Processing station 3 includes transport zone 15 and multiple processing units 16. Multiple processing units 16 are aligned on each side of transport zone 15.

Substrate transport device 17 is provided in transport zone 15. Substrate transport device 17 includes a wafer holding mechanism for holding a wafer (W). In addition, substrate transport device 17 is capable of moving horizontally and vertically as well as rotating around the vertical axis, and transports a wafer (W) between delivery table 14 and processing unit 16 using the wafer holding mechanism.

Processing unit 16 conducts predetermined treatments on a wafer (W) transported by substrate transport device 17.

Substrate processing system 1 includes control device 4. Control device 4 is a computer, for example, and includes control unit 18 and memory unit 19. Memory unit 19 stores a program for controlling various treatments carried out in substrate processing system 1. Control unit 18 controls operations to be performed in substrate processing system 1 by reading out and executing the program stored in memory unit 19.

Such a program may be stored in a computer-readable medium and installed from the memory medium onto memory unit 19 of control device 4. Examples of a computer-readable medium are hard disks (HD), flexible disks (FD), compact discs (CD), magneto-optical discs (MO), memory cards and the like.

In substrate processing system 1 structured as above, first, substrate transport apparatus 13 of loading station 2 takes out a wafer (W) from carrier (C) in carrier mounting zone 11, and loads the wafer (W) on delivery table 14. The wafer (W) loaded on delivery table 14 is unloaded by substrate transport device 17 of processing station 3 to be loaded into processing unit 16.

The wafer (W) loaded into processing unit 16 is treated in processing unit 16 and is unloaded from processing unit 16 by substrate transfer device 17 to be loaded onto delivery table 14. Then, the treated wafer (W) loaded on delivery table 14 is returned by substrate transport apparatus 13 to carrier (C) in carrier mounting zone 11.

Figure 2:
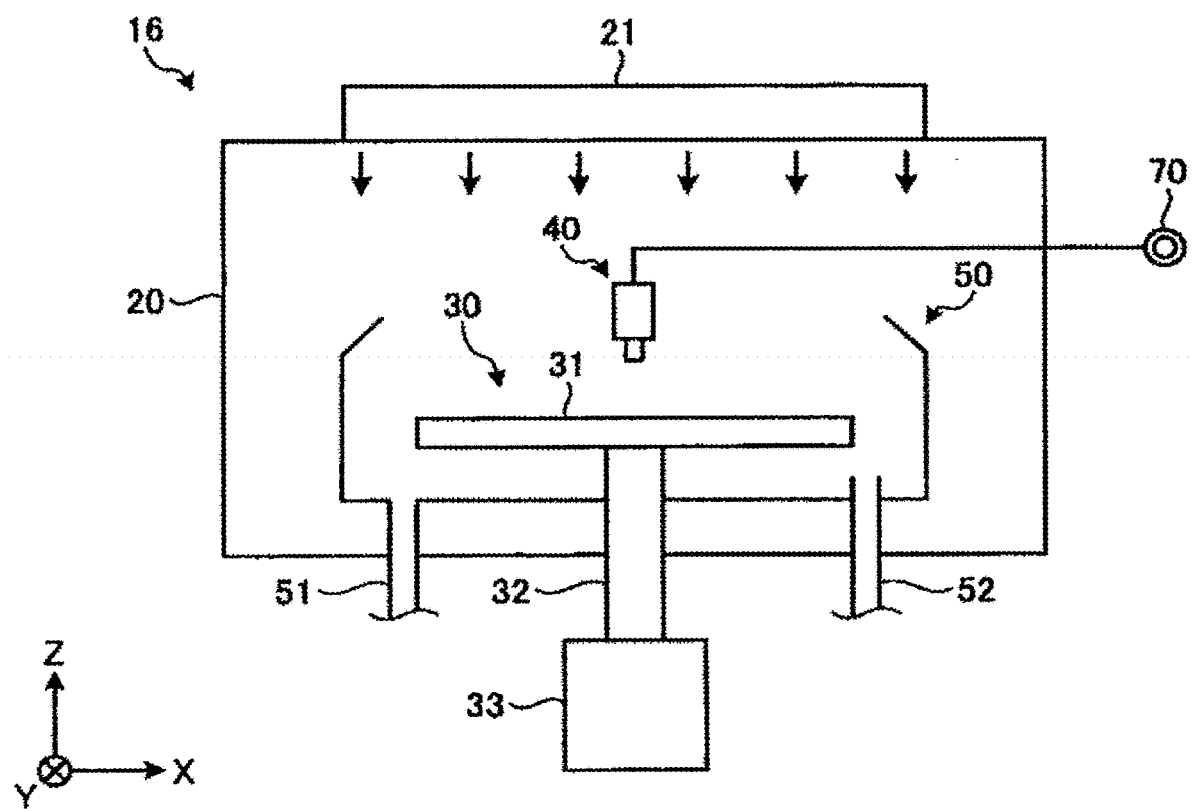
FIG. 2 is a vertical cross-sectional side view illustrating an outline of the processing unit.

As shown in FIG. 2, processing unit 16 is provided with chamber 20, substrate holding mechanism 30, processing liquid supply device 40 and collection cup 50.

Chamber 20 accommodates substrate holding mechanism 30, processing liquid supply device 40 and collection cup 50. Fan filter unit (FFU) 21 is installed on the ceiling of chamber 20. FFU 21 generates a downflow in chamber 20.

Substrate holding mechanism 30 is provided with holding device 31, support post 32, and driver device 33. Holding device 31 holds wafers (W) horizontally. Support post 32 is a component extending vertically with its base portion supported by driver device 33 so as to be rotatable, and horizontally supports holding device 31 at its top portion. Driver device 33 rotates support post 32 around the vertical axis. Substrate holding mechanism 30 structured as above rotates support post 32 using driver device 33 to rotate holding device 31 supported by support post 32. Accordingly, the wafer (W) held by holding device 31 is rotated.

Processing-liquid supply device 40 supplies a processing liquid to a wafer (W). Processing-liquid supply device 40 is connected to processing-liquid supply source 70.

Collection cup 50 is positioned to surround holding device 31, and collects the processing liquid scattered from a wafer (W) as holding device 31 rotates. Drain port 51 is formed at the bottom of collection cup 50, and the processing liquid collected in collection cup 50 is drained from drain port 51 to the outside of processing unit 16. In addition, exhaust port 52 is formed at the bottom of collection cup 50 so that the gas supplied from FFU 21 is exhausted to the outside of processing unit 16.

The processing unit 16 provided in the above-described substrate processing system 1 corresponds to a substrate processing apparatus according to an embodiment of the present invention. The processing unit 16 includes a structure for supplying a drying liquid to a rotating wafer (W) after the wafer (W) has been subjected to processing using a processing fluid (processing liquid) such as a chemical liquid or a rinse liquid, and drying the wafer (W) by moving a liquid contact point of the drying liquid from a center portion of the wafer (W) to a peripheral edge portion of the wafer (W). The drying liquid is a liquid that is more volatile than a rinse liquid and can be mixed with a rinse liquid. In the present embodiment, DIW (deionized water) is used as a rinse liquid, and IPA is used as a drying liquid.

The structure is described with reference to FIG. 3.

In the processing unit 16 of the present example, the above-described processing fluid supply part 40 includes a chemical liquid nozzle 413, a DIW nozzle 412 and an IPA nozzle 411 that respectively supply a chemical liquid, DIW as a rinse liquid, and IPA to the wafer (W) held by the substrate holding mechanism 30.

In the present example, the above-described nozzles (411-413) are provided in a front end portion of a common first nozzle arm 41. A base end side of the first nozzle arm 41 is connected to a guide rail 42 for moving the nozzles (411-413) between a position above a center portion of the wafer (W) held by the holding part (substrate holding part) 31 to a position retracted from the position above the wafer (W) to one side. A drive part 421 for moving the first nozzle arm 41 is provided in the guide rail 42. The first nozzle arm 41, the guide rail 42, and the drive part 421 correspond to a movement mechanism that relatively moves the IPA nozzle 411 with respect to the wafer (W) held by the holding part 31. Further, in FIG. 3, the first nozzle arm 41 retracted to one side is indicated using a solid line, and the first nozzle arm 41 that has entered the position above the center portion of the wafer (W) is indicated using a dashed line.

The chemical liquid nozzle 413 is connected to a chemical liquid supply source 73 via an on-off valve (V3). One or more kinds of chemical liquids are supplied from the chemical liquid supply source 73 depending on a purpose of processing of the wafer (W). The present embodiment is described in which one kind of a chemical liquid is involved. The chemical liquid is supplied from the chemical liquid nozzle 413 via the on-off valve (V3).

The DIW nozzle 412 is connected to a DIW supply source 72 via an on-off valve (V2). DIW is supplied from the DIW nozzle 412 via the on-off valve (V2). The above-described chemical liquid or DIW corresponds to a processing liquid for processing the wafer (W).

The IPA nozzle 411 corresponds to a drying liquid supply nozzle of the present example, and is connected to an IPA supply source 71 via an on-off valve (V1). IPA, which is a drying liquid that can be mixed with DIW, is supplied from the IPA supply source 71. The term "drying liquid" refers to a liquid that is more volatile than DIW and promotes drying of the wafer (W). The IPA supply source 71 includes a tank that stores liquid IPA, a liquid feeding mechanism such as a pump for feeding IPA from the tank to the IPA nozzle 411, and a flow rate control mechanism that includes a flow rate control valve and the like and controls a supply flow rate of IPA to be supplied to the IPA nozzle 411 (none of these are illustrated in the drawings).

Figure 3:
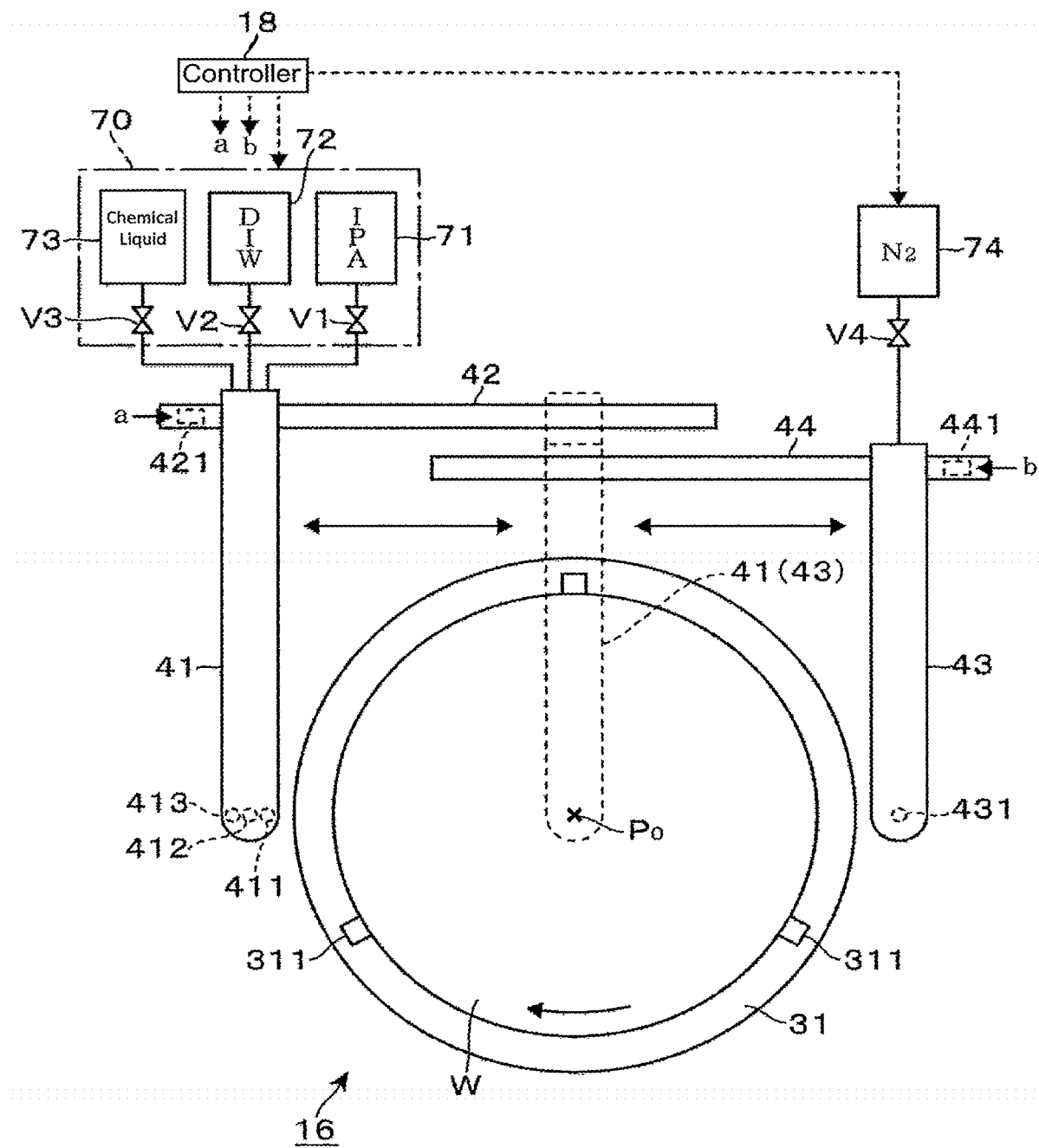
FIG. 3 is a plan view of the processing unit.

As illustrated in FIG. 3, the processing unit 16 includes an N2 nozzle 431 for supplying a nitrogen (N2) gas, which is an inert gas, as a drying gas to a surface of the wafer (W) after a drying liquid is supplied.

The N2 nozzle 431 of the present example is provided in a front end portion of a second nozzle arm 43, which is different from the above-described first nozzle arm 41 in which the IPA nozzle 411 and the like are provided. A base end side of the second nozzle arm 43 is connected to a guide rail 44 for moving the N2 nozzle 431 between a position above the center portion of the wafer (W) held by the holding part 31 and a position retracted from the position above the wafer (W) to one side. A drive part 441 for moving the second nozzle arm 43 is provided in the guide rail 44. In FIG. 3, the second nozzle arm 43 retracted to one side is indicated using a solid line, and the second nozzle arm 43 that has entered the position above the center portion of the wafer (W) is indicated using a dashed line (a dashed line in common with the above-described first nozzle arm 41).

The N2 nozzle 431 is connected to an N2 supply source 74 via an on-off valve (V4).

Movement of each of the nozzles (411-413, 431) described above with reference to FIG. 3 from the position above the wafer (W) to the position retracted from the position above the wafer (W), supply/stop of a fluid from each of the supply sources (71-74), and flow rate control are performed by the above-described controller 18.

Content of liquid processing performed using the processing unit 16 having the above-described structure is described with reference to FIG. 4-6.

When the wafer (W), which is carried into the processing unit 16 by the substrate carrying device 17, is held by holding pins 311 provided in the holding part 31, the first nozzle arm 41 retracted to one side is advanced to a position above the wafer (W), and the chemical liquid nozzle 413 and the DIW nozzle 412 are positioned at positions above a center portion (PO) of the wafer (W). Thereafter, a chemical liquid treatment is performed by rotating the wafer (W) at a predetermined rotation speed via the drive part 33, which is a rotation mechanism, and the support part 32 and supplying a chemical liquid from the chemical liquid nozzle 413.

When the treatment using a predetermined chemical liquid is finished, while the wafer (W) is kept rotating, a rinse cleaning treatment is performed by stopping the supply of the chemical liquid from the chemical liquid nozzle 413 and supplying DIW from the DIW nozzle 412. After the rinse cleaning treatment is performed for a predetermined period of time, while the wafer (W) is kept rotating, the supply of DIW from the DIW nozzle 412 is stopped, and IPA is supplied from the IPA nozzle 411 to replace the DIW.

In this case, the IPA nozzle 411 is positioned at a position where IPA can be supplied to the center portion (PO) of the wafer (W), and IPA is supplied to the center portion (PO). The supplied IPA spreads over a surface of the wafer (W) due to action of a centrifugal force, and an IPA liquid film is formed on the entire surface of the wafer (W). In this way, by forming the IPA liquid film, the DIW supplied to the surface of the wafer (W) during the rinse cleaning treatment can be replaced with IPA.

When the IPA liquid film is formed on the surface of the wafer (W), the IPA nozzle 411 is moved to one side from the position where IPA is supplied to the center portion (PO) (for example, the IPA nozzle 411 is moved to a position that is away from the center portion (PO) of the wafer (W) by 40 mm in a radial direction). As a result, due to the action of the centrifugal force, IPA flows out from a peripheral edge region of the center portion (PO) of the wafer (W) where IPA supplied from the IPA nozzle 411 does not reach, and a region (hereinafter, also referred to as a "core") where a liquid film does not exist is formed.

In accordance with the above-described movement of the IPA nozzle 411, the second nozzle arm 43 retracted to one side is advanced to a position above the wafer (W), and the N2 nozzle 431 is positioned at a position above the center portion (PO) of the wafer (W). Then, when the above-described core is formed, an N2 gas is supplied to the core to promote drying of the surface of the wafer (W).

Figure 4:
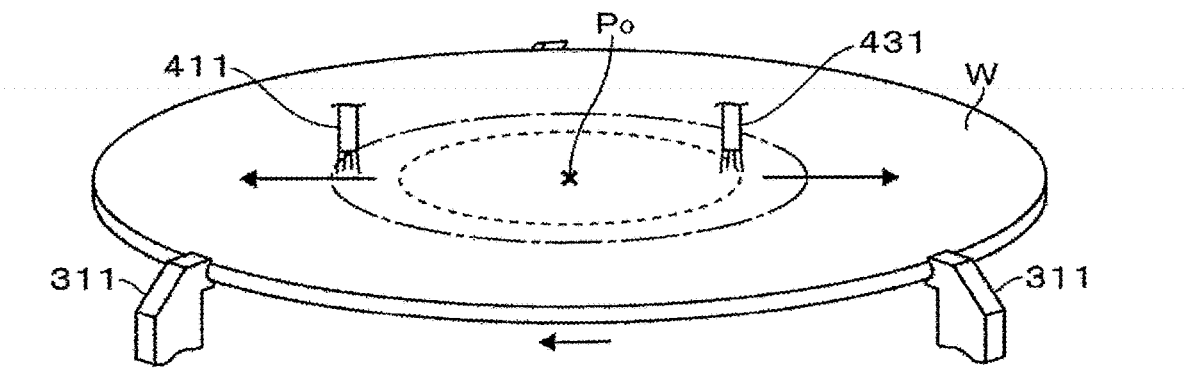
FIG. 4 is a perspective view illustrating a state of wafer processing using an IPA nozzle and an N2 nozzle provided in the processing unit.
Figure 5:
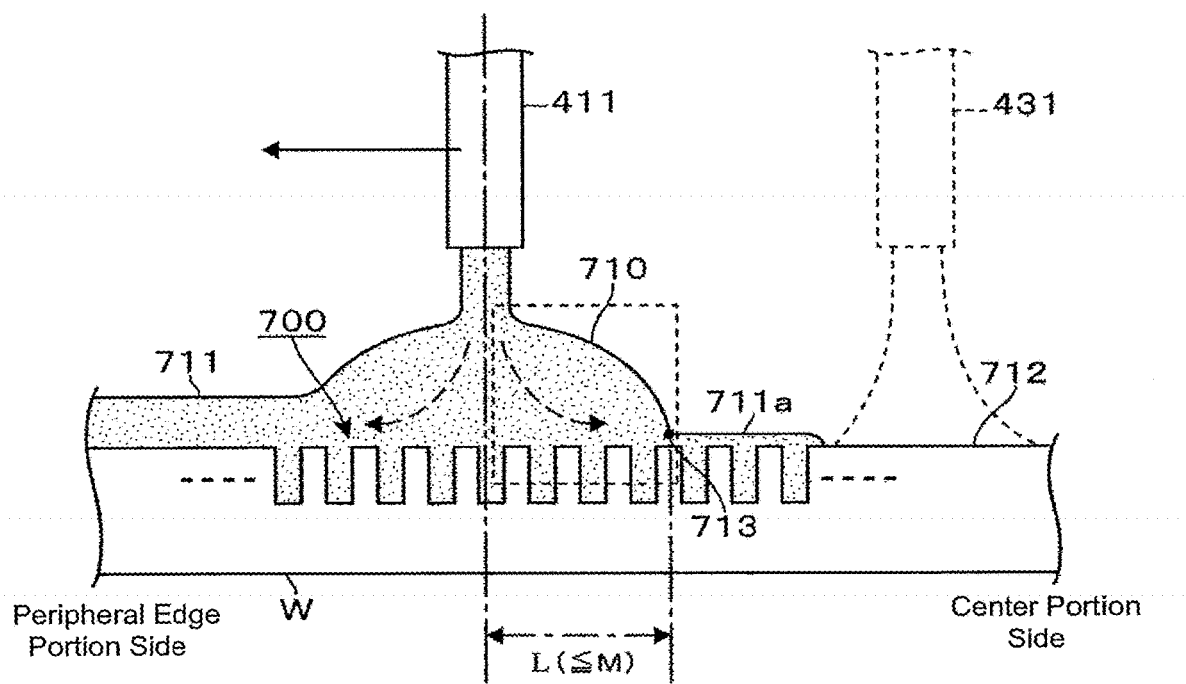
FIG. 5 is a schematic view from a lateral side of a vicinity of a liquid contact point of IPA discharged from the IPA nozzle.
Figure 6:
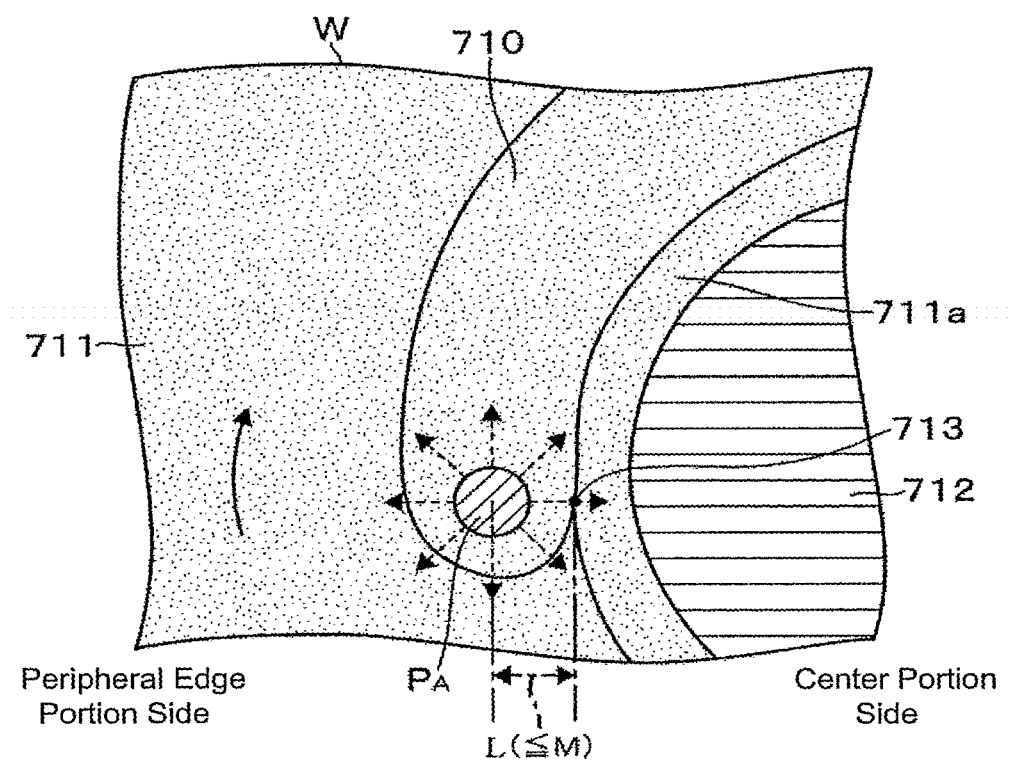
FIG. 6 is schematic view from above of the vicinity of the IPA liquid contact point.

In order to facilitate understanding of positional relationship between a position at which IPA is discharged from the IPA nozzle 411 and a position at which the N2 gas is discharged from the N2 nozzle 431 in the positioning state of FIG. 4, in FIG. 5, assuming that the N2 nozzle 431 is moved in the same direction as the IPA nozzle 411, the position of the N2 nozzle 431 and the discharge position of the N2 gas are indicated using dashed lines.

As illustrated in FIG. 4, while the rotation of the wafer (W), the supply of IPA from the IPA nozzle 411, and the supply of the N2 gas from the N2 nozzle 431 are continued, the nozzles (411, 431) are moved toward the peripheral edge portion of the wafer (W) (in the present example, the two nozzles (411, 431) are moved in opposite directions). As a result, the supply position of the IPA (indicated by a one-dotted chain line in FIG. 4) and the supply position of the N2 gas (indicated by a broken line in the same figure) are moved toward the peripheral edge portion side of the wafer (W) so as to scan the entire surface of wafer (W). Further, as is clear from the positional relationship between the one-dotted chain line and the dashed line in FIG. 4, in the above-described scan operation, the movements of the nozzle arms (41, 43) are controlled such that the supply position of the N2 gas from the N2 nozzle 431 is positioned on a center portion side of the supply position of the IPA from the IPA nozzle 411 in the radial direction of the wafer (W).

Along with the scan operation of the supply position of the IPA, the IPA liquid film is swept to the peripheral edge portion side of the wafer (W), and the region where the liquid film is not formed expands. Further, along with the scan operation of the supply position of the N2 gas, the N2 gas is blown onto the surface of the wafer (W) after the IPA liquid film is swept away, and drying of the region is completed.

When the supply position of the IPA reaches the periphery edge of the wafer (W), the supply of the IPA from the IPA nozzle 411 is stopped. Subsequently, when the supply position of the N2 gas reaches the periphery edge of the wafer (W), the supply of the N2 gas from the N2 nozzle 431 is stopped.

By the above-described operations, the DIW can be replaced by the IPA and removed from the entire surface of the wafer (W), and a dried wafer (W) can be obtained.

After the completion of the drying of the wafer (W), the rotation of the wafer (W) is stopped; the substrate carrying device 17 is advanced into the processing unit 16; the wafer (W) is transferred from the holding part 31 to the substrate carrying device 17; and the processed wafer (W) is taken out from the processing unit 16. In this way, a series of processes with respect to the wafer (W) in the processing unit 16 is completed.

In the above, a method is described in which, with respect to the wafer (W) after being subjected to processing by supplying a processing liquid such as a chemical liquid or DIW to the wafer (W), the IPA (drying liquid) is further supplied to replace the processing liquid, and the supply position of the IPA is moved from the center portion of the wafer (W) toward a peripheral edge portion of the wafer (W), and thereby, the wafer (W) is dried.

It was confirmed that, when the wafer (W) is dried using this method, annular defects (pattern collapse, particle adhesion, cleaning residues) may occur in a part of the surface of the wafer (W). Therefore, as a result of an examination regarding factors causing such an event to occur, it was found that behavior of the IPA at a liquid contact point, which is a position at which the IPA supplied from the IPA nozzle 411 reaches the wafer (W), influences the occurrence of the defects.

In the following, with reference to FIG. 5-8, a mechanism by which defects such as pattern collapse occur and an IPA supply method according to an embodiment as a countermeasure for the occurrence of the defects are described in comparison with a conventional method.

FIG. 5 schematically illustrates from a side-surface side a result of observing a neighboring region of a liquid contact point (PA), which is a position at which the IPA discharged from the IPA nozzle 411 reaches at the wafer (W). FIG. 6 is a schematic view illustrating the same region from an upper-surface side.

According to the observation result of the region, the IPA discharged from the IPA nozzle 411 and reached at the liquid contact point (PA) attempts to isotropically spread in an IPA liquid film 711. On the other hand, a centrifugal force from the rotating wafer (W) acts on the IPA. Therefore, the IPA forms swirling flow-like IPA flow lines 710 illustrated in FIG. 6, and is eventually absorbed into the IPA liquid film 711. In this case, the IPA supplied to the wafer (W) enters a pattern 700 formed on the surface of the wafer (W) and replaces the DIW. In FIG. 5, the pattern 700 formed in the neighboring region of the liquid contact point (PA) is schematically illustrated.

When the scan operation of the IPA nozzle 411 is performed, along with the movement of the IPA nozzle 411, the position of the liquid contact point (PA) and the formation region of the IPA flow lines 710 also move. In this case, a phenomenon is observed that, in a region on an inner side of the IPA flow lines 710, a thin IPA liquid film (hereinafter referred to as a center portion side IPA liquid film (711a)) that cannot follow the movement of the IPA nozzle 411 remains (FIGS. 5 and 6).

The center portion side IPA liquid film (711a) that cannot follow the movement of the IPA nozzle 411 is removed from the surface of the wafer (W) by evaporation of the IPA. In this case, when the IPA is not uniformly removed in a plane of the center portion side IPA liquid film (711a), surface tension of the IPA acts unevenly on the pattern 700, and this becomes a factor causing pattern collapse. Further, it is understood that, in a region where the IPA is not uniformly removed, particle adhesion and cleaning residues are also likely to occur.

Further, it was found that the above-described defects including pattern collapse become more likely to occur as a width of the center portion side IPA liquid film (711a) (formation region of the center portion side IPA liquid film (711a)) increases, whereas when the width of the center portion side IPA liquid film (711a) is limited to a small range, occurrence of the defects can be suppressed.

As a result of examining factors affecting the width of the center portion side IPA liquid film (711a), it was found that influence of an amount of IPA flowing from the liquid contact point (PA), where the IPA is supplied to wafer (W), to the center portion side of the wafer (W) is large. It was found that the amount of the IPA flowing into the center portion side of the wafer (W) can be understood by a distance (L) between a center of the liquid contact point (PA) and an edge 713 (an interface between the IPA flow lines 710 and the center portion side IPA liquid film (711a)) of the IPA flow lines 710 on a rotation center side of the wafer (W).

That is, when the distance (L) increases, the amount of the IPA flowing into the center side of the wafer (W) increases, the amount of the IPA that cannot follow the movement of the IPA nozzle 411 increases, and the width of the center portion side IPA liquid film (711a) increases. On the other hand, when the distance (L) decreases, the amount of the IPA flowing into the center side of the wafer (W) decreases, and the width of the center portion side IPA liquid film (711a) can be decreased.

Further, when the drying of the wafer (W) is performed by varying conditions such that the distance (L) gradually increases from a state of the distance (L) where a drying result with a sufficiently small number of occurrences of defects is obtained, from a point of view of production efficiency and the like, there is a critical distance at which the number of occurrences of defects cannot be ignored. Therefore, when the distance (L) of the IPA flow lines 710 formed on the surface of the wafer (W) is controlled with a distance (M) shorter than the critical distance as an upper limit (hereinafter referred to as an "upper limit distance (M)"), the number of occurrences of defects can be reduced to a predetermined number or less.

Here, when IPA is supplied from the IPA nozzle 411 to the wafer (W), since the IPA flow lines 710 are clearly formed, the distance (L) can be clearly understood. On the other hand, defects often depend on a structure of the pattern 700 formed on the surface of the wafer (W) so that the upper limit distance (M) cannot be generally specified. For example, there may be a case where an upper limit distance (M) that allows defects to be sufficiently suppressed during production of semiconductor devices of a certain generation includes a distance (L) that causes a large number of defects during production of semiconductor devices of a successor generation for which the pattern 700 has thinner line width than that of the previous generation.

However, an effect of shortening the distance (L) in the IPA flow lines 710 can be clearly understood as a reduction in the number of defects. By focusing on this point, the upper limit distance (M) can be defined without depending on the structure of pattern 700.

Therefore, among pattern images obtained by imaging the pattern 700 through performing preliminary experiments or the like, an ideal pattern image of the wafer (W), for which the number of defects is equal to or less than an allowable value in production management (the number of defects is not necessarily required to be zero), is set as a reference value. Next, after a process is performed in which, for example, the wafer (W) is dried by controlling the IPA supply flow rate such that the distance (L) becomes a preset value, a pattern image of the wafer (W) after the process is obtained and is compared with the ideal pattern image, and the number of defects is counted by detecting each changed place in the pattern image with respect to the ideal pattern image as a defect. Then, the drying of the wafer (W) using IPA and the counting of defects in the dried wafer (W) are performed under multiple conditions in which a control condition is changed such that the distance (L) is gradually decreased. As a result, a distance (L) at which an average increase in the number of defects occurring per 1 cm² of the surface of the wafer (W) is 5 or less is defined as the above-described upper limit distance (M).

A method for controlling the distance (L) of the IPA flow lines 710 (the distance (L) between the center of the liquid contact point (PA) and the edge 713 of the IPA flow lines 710 on the rotation center side of the wafer (W)) is described.

When the IPA isotropically spreads from the liquid contact point (PA), the distance (L) is influenced by a flow rate (hereinafter, referred to as an "IPA center inflow rate") of the IPA flowing into the center portion side of the wafer (W) rather than the liquid contact point (PA). That is, the distance (L) is increased when the IPA center inflow rate is increased, and the distance (L) is decreased when the IPA center inflow rate is decreased. Further, perimeters of orbit circles respectively drawn by the liquid contact point (PA) in the center portion and the peripheral edge portion of the wafer (W) are different. Therefore, the IPA center inflow rate per unit section of an orbit circle changes. That is, when a discharge rate of IPA from the IPA nozzle 411 is constant, the IPA center inflow rate per unit section is larger in the center portion (where the perimeter of the orbit circle drawn by the liquid contact point (PA) is shorter than that in the peripheral edge portion) than in the peripheral edge portion (where the perimeter of the orbit circle is long).

Based on the above-described relationship, the IPA center inflow rate per unit section of an orbit circle drawn by the liquid contact point (PA) is expressed in terms of a relation between a scan speed (moving speed) of the liquid contact point (PA) and the IPA supply flow rate.

When the liquid contact point (PA) is sufficiently small (for example, is the same as an opening diameter of the IPA nozzle 411) and half of isotropically spreading IPA flows into the center portion side of the wafer (W), the above-described IPA center inflow rate can be expressed using the following formula (1).

$$\text{IPA center inflow rate (ml/mm)} = \{(Q/2)*t\}/C \text{(where } t=D/v\text{)} \tag{1}$$

Here, D is the opening diameter (mm) of the IPA nozzle 411; Q is the IPA supply flow rate (ml/s); v is the scan speed (mm/s) of the liquid contact point (PA); and C is the perimeter (mm) of the orbit circle drawn by the liquid contact point (PA). The IPA supply flow rate is assumed to be, for example, in a range of 1-300 ml/min (0.017-5 ml/s).

Factors, other than the distance (L) of the IPA flow lines 710, that cause defects are also examined.

As described above, when a large centrifugal acceleration (centrifugal force) due to the rotation of the wafer (W) is applied to the center portion side IPA liquid film (711a) that has an unstable thickness, there is a risk that events are likely to occur such as that the IPA in this region is unevenly dried and that pieces of IPA torn from the center portion side IPA liquid film (711a) are left on the surface of the wafer (W).

FIG. 8A-8D are graphs in which values of the scan speed (FIG. 8A) of the liquid contact point (PA), the IPA center inflow rate (FIG. 8B), the rotation speed (FIG. 8C) of the wafer (W), and the centrifugal acceleration (FIG. 8D) acting on the IPA supplied to the liquid contact point (PA), according to a comparative embodiment in which annular defects are confirmed, are respectively displayed in correspondence to a radial direction distance from the center portion (PO) of the wafer (W) to the liquid contact point (PA).

In this comparative embodiment, the opening diameter of the IPA nozzle 411 is D=2 mm, and the IPA supply flow rate is Q=0.54 ml/s and is constant.

Figure 8A:
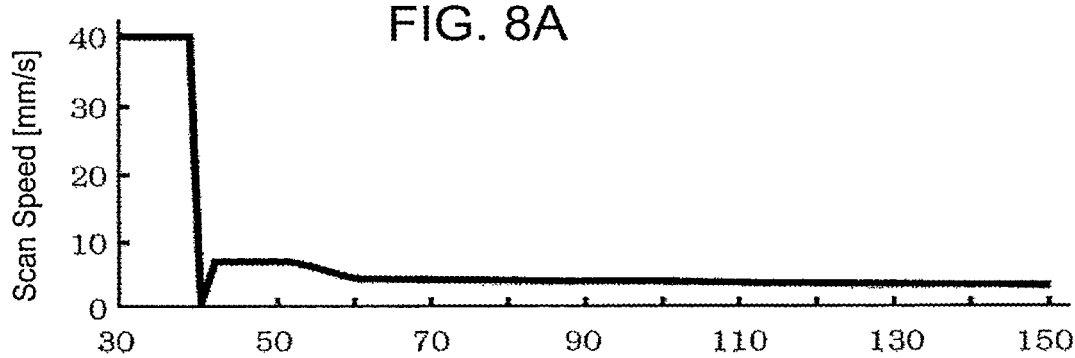
FIGS. 8A-8D are explanatory diagrams of operations of IPA supply by a processing unit according to a comparative embodiment.

According to FIG. 8A, IPA is supplied from the IPA nozzle 411 to the center portion (PO) of the wafer (W), and the IPA liquid film 711 is formed on the entire surface of the wafer (W). Thereafter, in order to form the core, the liquid contact point (PA) is moved to a position 40 mm from the center portion (PO) at a scan speed of 40 mm/s, and thereafter, the scan of the liquid contact point (PA) is once stopped. Then, after the core is formed, the liquid contact point (PA) is moved at a scan speed of about 7 mm/s in a region of 40-50 mm from the center portion (PO). Thereafter, the scan speed is gradually reduced, and in a region of more than 60 mm on the peripheral edge portion side, the liquid contact point (PA) is moved at a constant scan speed of about 5 mm/s.

Figure 8B:
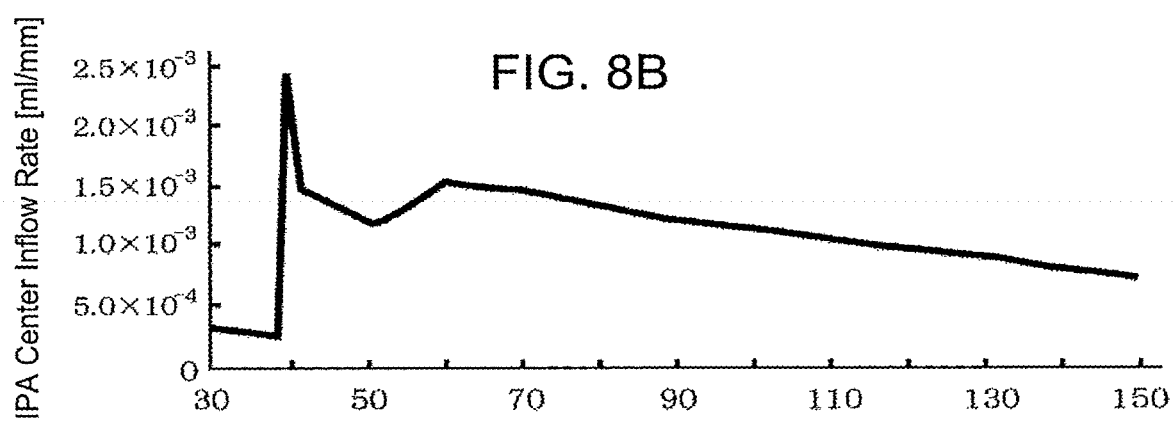

When the IPA center inflow rate is calculated based on the above-described variation of the scan speed of the liquid contact point (PA) (FIG. 8A) and based on the above-described formula (1), as illustrated in FIG. 8B, the value of the IPA center inflow rate greatly changes according to the distance of the liquid contact point (PA) from the center portion (PO) (position in the radial direction of the wafer (W)). Then, in the region where the IPA center inflow rate increases, the above-described distance (L) increases, and the center portion side IPA liquid film (711a) becomes larger, which is a factor causing defects.

Figure 8C:
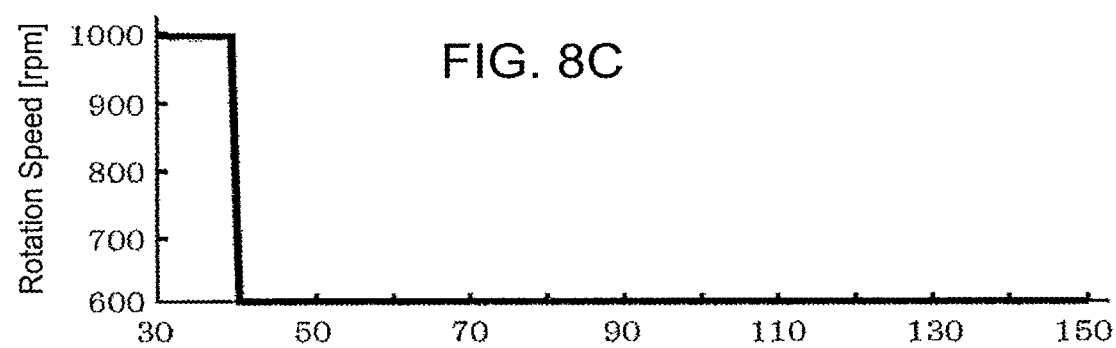

When focusing on the rotation speed of the wafer (W), as illustrated in FIG. 8C, in the formation region of the core where the distance from the center portion (PO) to the liquid contact point (PA) is up to 40 mm, the rotation speed of the wafer (W) is 1000 rpm; and after the liquid contact point (PA) is further moved to the peripheral edge portion side, the rotation speed of the wafer (W) is reduced to 600 rpm.

Along with the above-described variation in the rotation speed of the wafer (W) according to the position of the liquid contact point (PA), the centrifugal acceleration acting on the IPA supplied to the liquid contact point (PA) also greatly varies. Then, due to both the influence of the variation in the centrifugal acceleration and the increase in the distance (L) of the IPA flow lines 710 (which is due to the variation in the IPA center inflow rate described using FIG. 8B), annular defects are considered to have occurred.

Figure 7A:
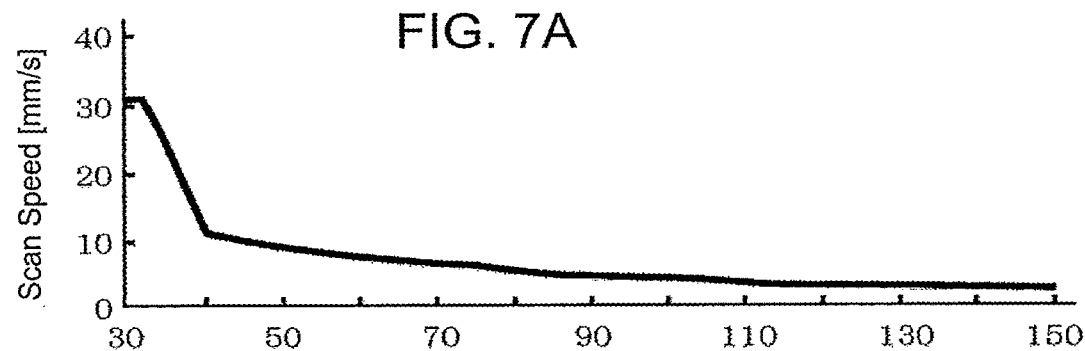
FIG. 7A-7D are explanatory diagrams of operations of IPA supply by the processing unit according to the embodiment.
Figure 7B:
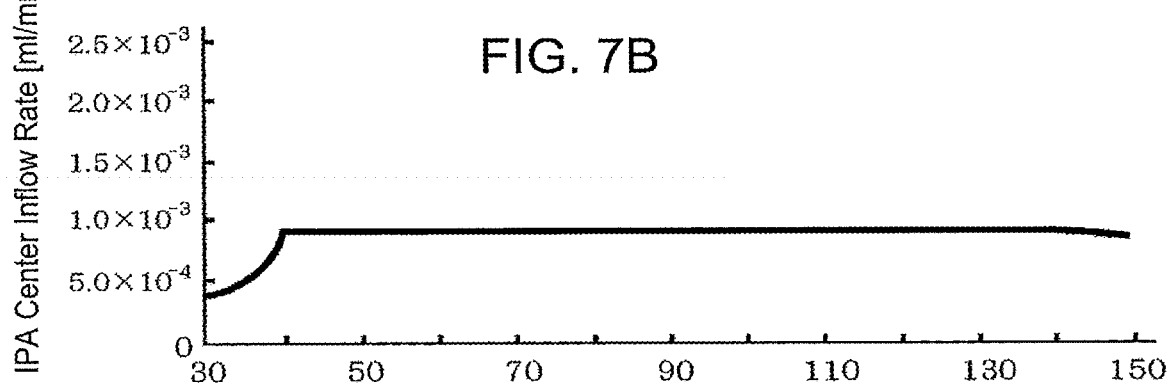
Figure 7C:
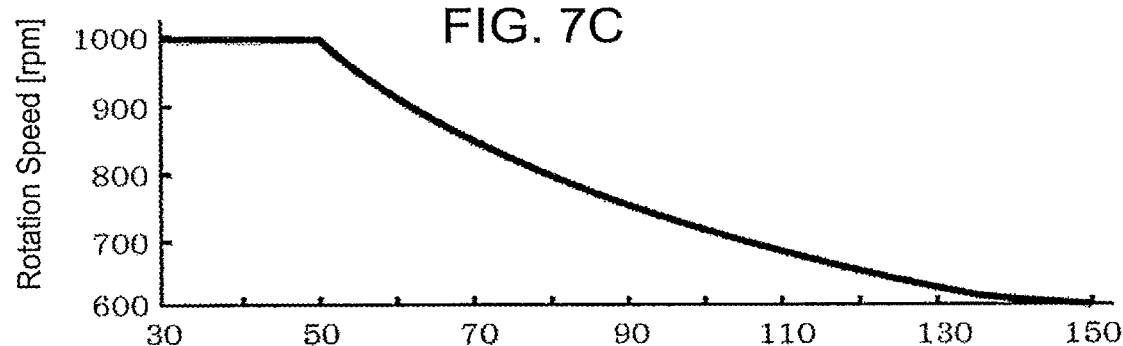
Figure 7D:
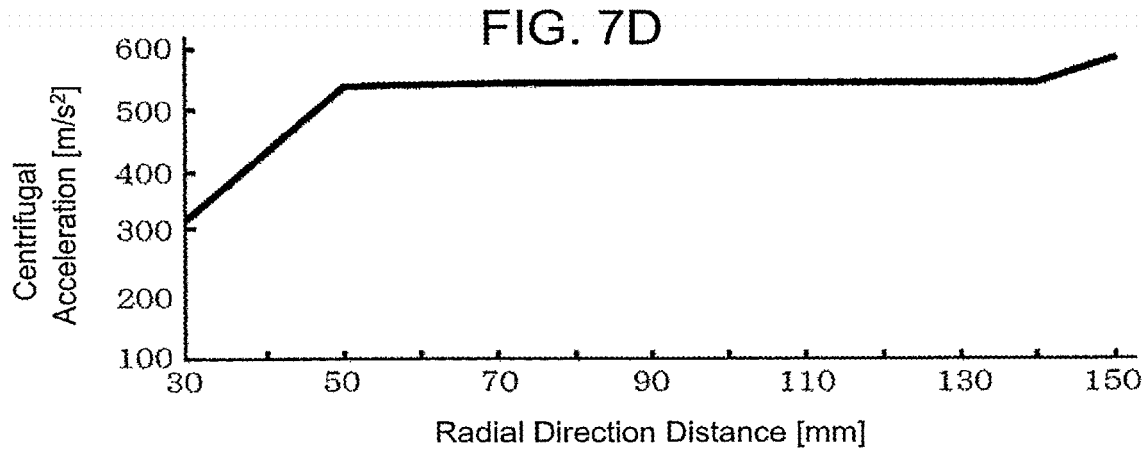

Based on the IPA supply method according to the comparative embodiment examined with reference to FIG. 8A-8D, in the processing unit 16 according to the present embodiment, the distance (L) of the IPA flow lines 710 after the core is formed is kept equal to or less than the predetermined upper limit distance (M). Therefore, by controlling the scan speed of the liquid contact point (PA), the IPA center inflow rate is kept substantially constant along the movement direction of the liquid contact point (PA) (FIG. 7B). Further, after the core is formed, control of the rotation speed of the wafer (W) is also performed such that the centrifugal acceleration acting on the IPA supplied to the liquid contact point (PA) is substantially constant along the movement direction of the liquid contact point (PA) (FIG. 7D).

As examined in the comparative embodiment, when an increase in the IPA center inflow rate or a change in the centrifugal acceleration acting on the IPA at the liquid contact point (PA) occurs, uneven drying of the center portion side IPA liquid film (711a) and IPA residues on the surface of the wafer (W) are likely to occur. Therefore, in the present embodiment, suppression of defects is achieved by performing the drying of the wafer (W) by moving the IPA liquid contact point (PA) while keeping the IPA center inflow rate (the distance (L) of the IPA flow lines 710) at a certain value or lower and keeping the centrifugal acceleration acting on the IPA at the liquid contact point (PA) constant.

In the above-described comparative embodiment, in the peripheral edge portion of the wafer (W), substantially no annular defects described above were found. Therefore, the distance (L) of the IPA flow lines 710 formed in this region is a value equal to or less than the upper limit distance (M). Therefore, in the processing unit 16 according to the present embodiment, a method is adopted in which the scan speed of the liquid contact point (PA) or the rotation speed of the wafer (W) is controlled such that the value of the IPA center inflow rate or the value of the centrifugal acceleration acting on the IPA matches that of the IPA center inflow rate or the centrifugal acceleration in the peripheral edge portion of the comparative embodiment.

For example, according to FIG. 8B, the IPA center inflow rate in the peripheral edge portion of the wafer (W) is about $9.0 \times 10^{-4}$ ml/mm. Therefore, the scan speed of the liquid contact point (PA) at each position is determined based on the above-described formula (1) such that the center inflow rate of the IPA in a region other than the formation region of the core matches the above-described value (FIG. 7A). Further, in order not to cause sudden variation in the IPA center inflow rate, the scan of the liquid contact point (PA) was not stopped at an outer edge of the core formation region (in the present example, at a position 40 mm away from the center portion (PO) in the radial direction). Then, the scan speed of the liquid contact point (PA) in the core formation region is gradually decreased such that the scan speed calculated based on the formula (1) is started when passing through the outer edge of the core formation region.

Figure 8D:
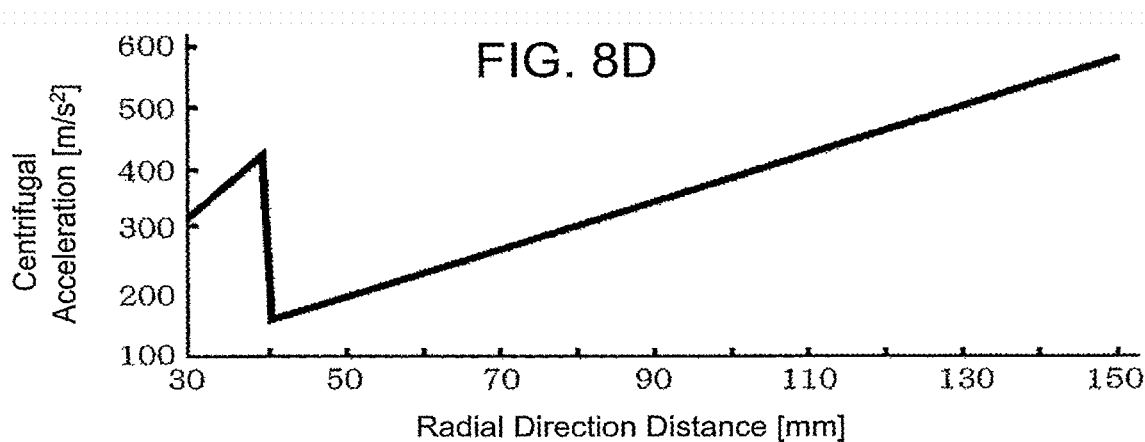

According to FIG. 8D, the centrifugal acceleration acting on the IPA at the liquid contact point (PA) in the peripheral edge portion (in the formation region of the pattern 700) of the wafer (W) is about 550 m/s2. Therefore, the rotation speed of the wafer (W) was determined based on a calculation formula $G = r\omega^2$ (where G is the centrifugal acceleration (m/s$^2$); r is a distance (m) from the center portion (PO) to the liquid contact point (PA); and $\omega$ is an angular velocity (rad/s) of the wafer (W)) for the centrifugal acceleration such that the centrifugal acceleration in a region other than the core formation region matches the above-described value (FIG. 7C). In the core formation region, in order to reliably discharge the IPA in this region, for example, the wafer (W) was rotated at 1000 rpm, which is an upper limit of a range of use of the drive part 33.

Based on the above-described idea, by setting the scan speed of the liquid contact point (PA) or the rotation speed of the wafer (W) (setting an operation variable), along the movement direction of the liquid contact point (PA), the IPA center inflow rate can be kept equal to or less than a certain value (the distance (L) of the IPA flow lines 710 can be kept equal to or less than the upper limit distance (M)) and the value of the centrifugal acceleration acting on the IPA can be kept constant.

In the present embodiment, the term "keeping the centrifugal acceleration acting on the IPA constant" includes, in addition to a case where the operation variable is controlled such that the value of the centrifugal acceleration is strictly kept constant, also a case where, for example, depending on control stability or a response speed, the control is performed such that a variation range of the centrifugal acceleration is, for example, within a range of about ±5% of a target value.

It is not necessarily required that, as described above, along the movement direction of the liquid contact point (PA), an upper limit of the IPA center inflow rate or a target value of the centrifugal acceleration acting on the IPA, matches that in the peripheral edge portion of the wafer (W) in the comparative embodiment. As described above, by adjusting the IPA center inflow rate such that the distance (L) of the IPA flow lines 710 is equal to or less than the upper limit distance (M), and keeping the centrifugal acceleration acting on the IPA "constant along the movement direction of the liquid contact point (PA)," an effect can be achieved that occurrence of uneven drying associated with growth and contraction of the center portion side IPA liquid film (711a) and occurrence of IPA residues are suppressed and occurrence of defects is suppressed.

However, an example of ranges in which a better defect suppression effect can be obtained is a case where the target value of the IPA center inflow rate is set to 0.001 ml/mm or less and the target value of the centrifugal acceleration acting on the IPA at the liquid contact point (PA) is set to a value within a range of 60-13000 m/s$^2$ (corresponding to that the rotation speed of the wafer (W) is in a range of 200-3000 rpm).

When the wafer (W) was dried using the IPA supply method according to the embodiment described using FIG. 7A-7D, the annular defects that were observed in the comparative embodiment were not observed, and a good defect suppression effect was obtained.

According to the above-described processing unit 16 of the present embodiment, the following effects can be achieved. With respect to a wafer (W) that has been subjected to processing using a processing liquid such as a chemical liquid or DIW, IPA, which is a drying liquid, is supplied to a surface of the wafer (W), which is rotating, and the liquid contact point (PA) of the IPA is moved from a center portion of the substrate toward a peripheral edge portion of the substrate. Thereby, a dried substrate is obtained. In this case, an inflow rate of the IPA flowing from the liquid contact point (PA) to the center portion side of the wafer (W) is controlled such that the distance (L) of the IPA flow lines 710 (the distance (L) between the center of the liquid contact point (PA) and the edge 713 of the IPA flow lines 710 on the rotation center side of the wafer (W)) is equal to or less than the upper limit distance (M) at which an average increase in the number of defects occurring per 1 cm2 of the surface of the wafer (W) with respect to an ideal pattern image is 5 or less. Further, the moving speed of the liquid contact point (PA) is varied such that the centrifugal acceleration acting on the IPA is constant along the movement direction of the liquid contact point (PA). As a result, liquid residues on the center portion side of the liquid contact point (PA) on the substrate and occurrence of uneven drying can be suppressed, and occurrence of defects can be suppressed.

As described using FIG. 7B, the operation variable for adjusting the distance (L) of the IPA flow lines 710 (adjusting the IPA center inflow rate) is not limited to the scan speed of the liquid contact point (PA).

Figure 10A:
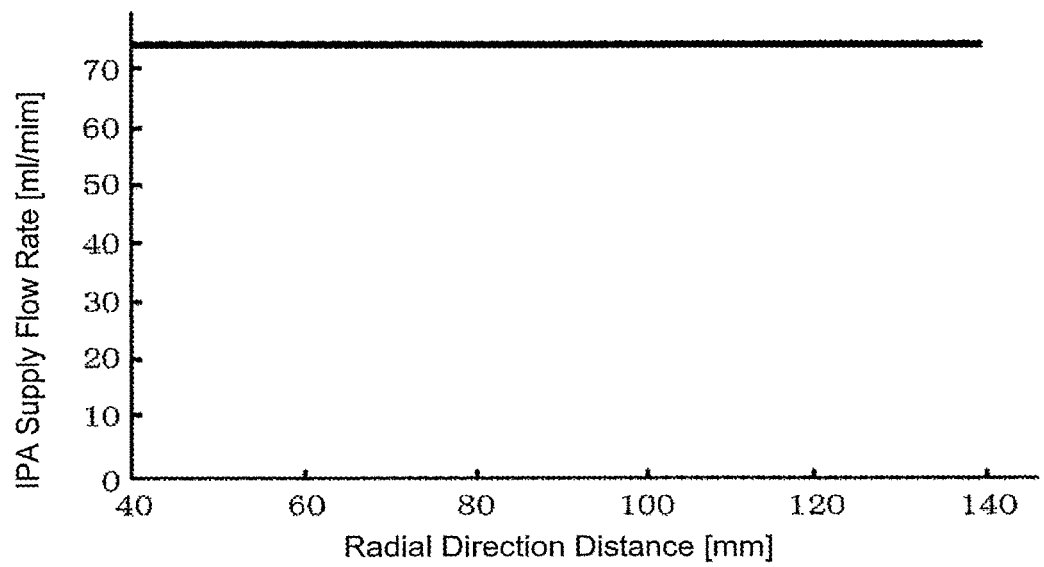
FIGS. 10A and 10B are explanatory diagrams of operations of IPA supply by a processing unit according to a second comparative embodiment.
Figure 10B:
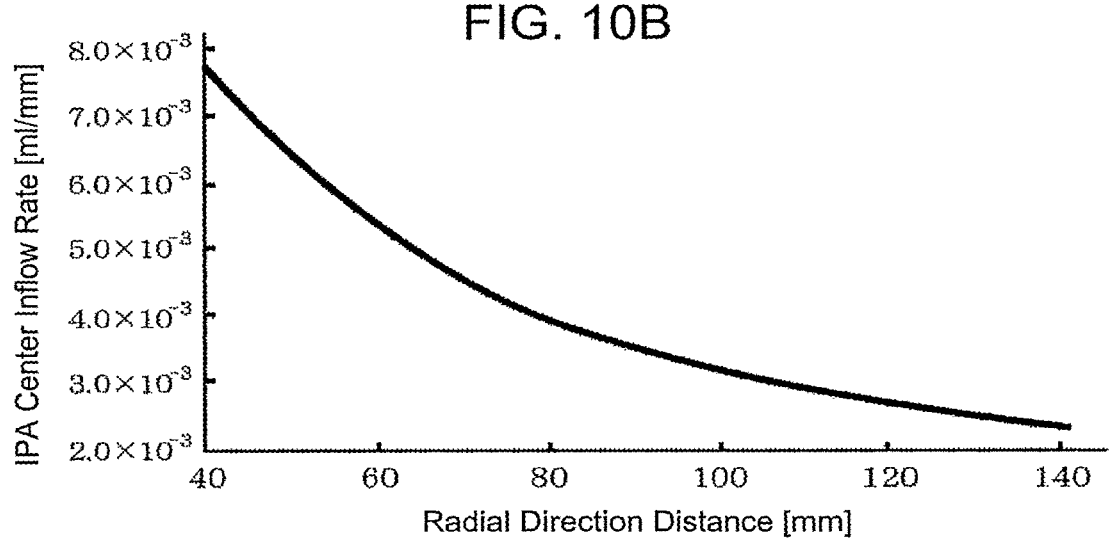

For example, under a condition that the scan speed of the liquid contact point (PA) is fixed at a constant value, as illustrated in a second comparative embodiment of FIG. 10A, when the IPA supply flow rate from the IPA nozzle 411 is kept constant, the IPA center inflow rate is reduced as the liquid contact point (PA) moves from the center portion side of the wafer (W) toward the peripheral edge portion side of the wafer (W) (FIG. 10B).

Therefore, under the condition that the scan speed of the liquid contact point (PA) is fixed, even by varying the IPA supply flow rate such that the IPA center inflow rate is constant, the IPA center inflow rate can be adjusted (for example, kept constant) such that the distance (L) of the IPA flow lines 710 along the movement direction of the liquid contact point (PA) is equal to or less than the upper limit distance (M). The IPA supply flow rate in this case can also be calculated using the above-described formula (1).

Figure 9A:
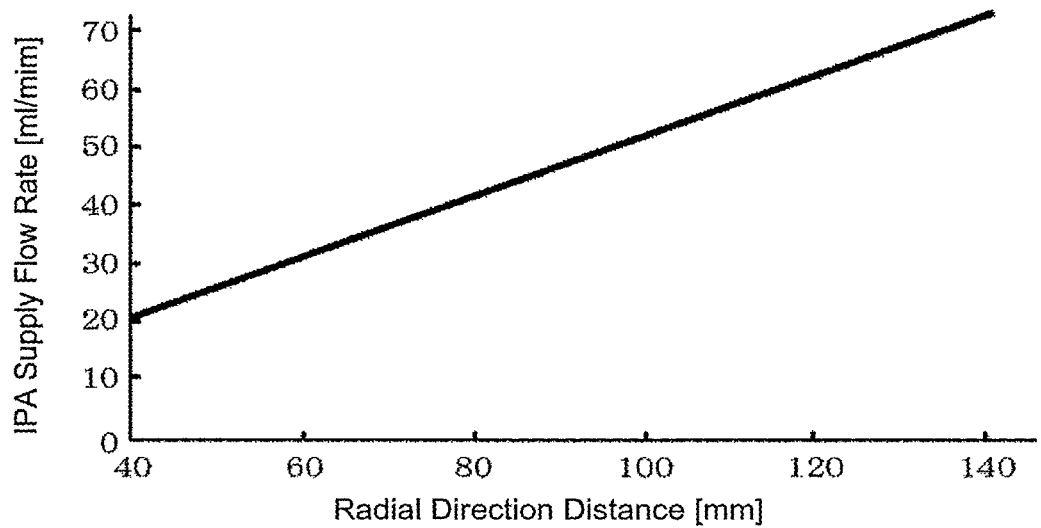
FIGS. 9A and 9B are explanatory diagrams of operations of IPA supply by a processing unit according to a second embodiment.
Figure 9B:
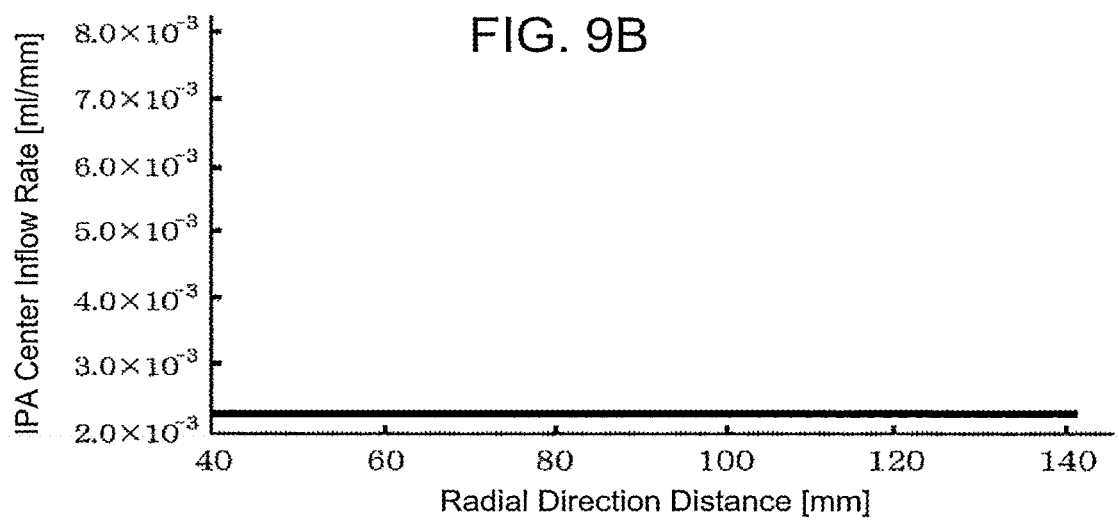

As a confirmation that the IPA center inflow rate can be adjusted, a second embodiment of FIGS. 9A and 9B illustrated an example in which the IPA supply flow rate along the movement direction of the liquid contact point (PA) is varied so as to match the IPA center inflow rate in the peripheral edge portion of the second comparative embodiment illustrated in FIG. 10B.

The operation variable for adjusting the IPA center inflow rate is not limited to the case of selecting one of the scan speed of the liquid contact point (PA) of the IPA and the IPA supply flow rate. It is also possible that both of the operation variables are varied.

In the second embodiment illustrated in FIGS. 9A and 9B, similar to the example described using FIGS. 7C and 7D, it is also possible that the rotation speed of the wafer (W) is varied such that the centrifugal acceleration acting on the IPA at the liquid contact point (PA) is constant along the movement direction of the liquid contact point (PA).

Figure 12:
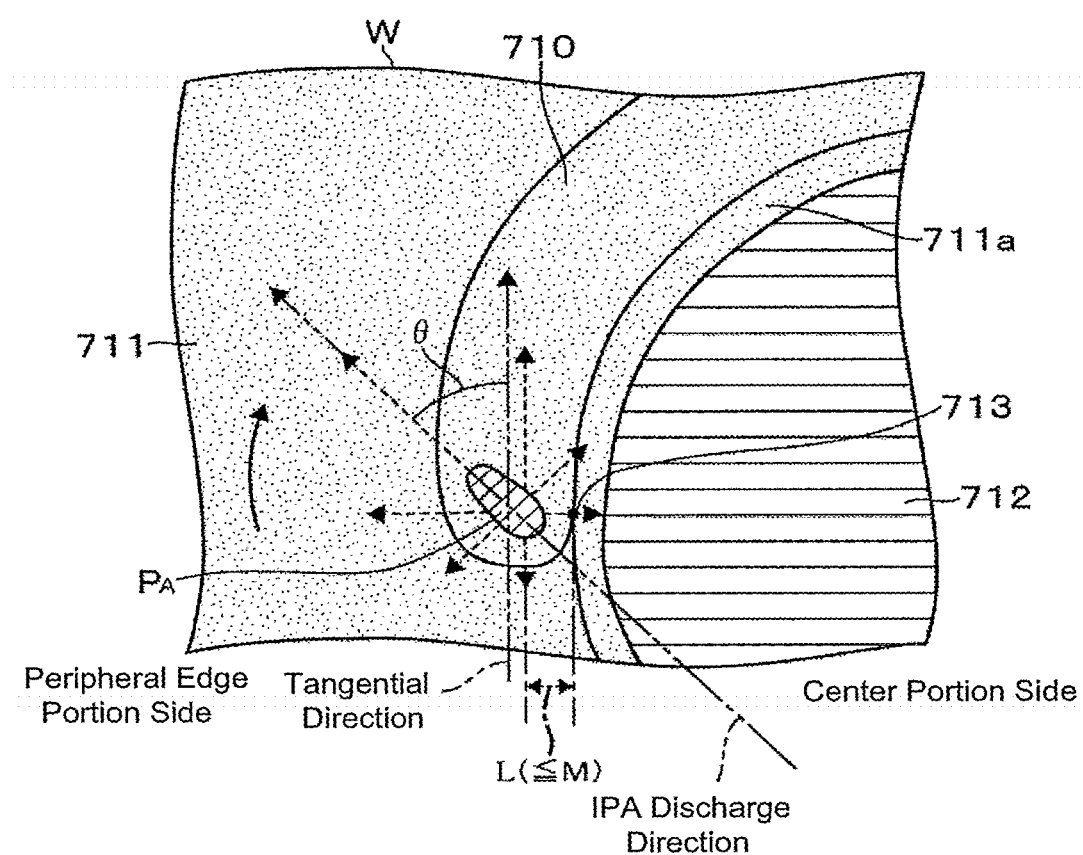
FIG. 12 is schematic view from above of the vicinity of the IPA liquid contact point according to the third embodiment.

The side view and the plan view respectively illustrated in FIGS. 11 and 12 illustrate a third embodiment in which the distance (L) is shortened to reduce the formation region of the center portion side IPA liquid film (711a) by positioning an IPA nozzle (411a) in an inclined state.

In this embodiment, as illustrated in FIG. 11, the IPA nozzle (411a) is positioned in a state in which a discharge direction of the IPA liquid is inclined such that, as viewed from the rotation center of the wafer (W), a liquid contact point (PA) of the IPA on the wafer (W) is positioned on a peripheral edge portion side of a discharge position of the IPA from the IPA nozzle (411a). By discharging the IPA in a direction away from the center portion side of the wafer (W), the distance (L) can be shortened. As a result, the width of the center portion side IPA liquid film (711a), which influences the occurrence of defects, can be shortened.

As illustrated in FIG. 12, it is preferable that the IPA nozzle (411a) be positioned such that, in a plan view of the wafer (W), with respect to the orbit circle drawn by the liquid contact point (PA), an angle ($\theta$) formed by an tangent extending along a direction in which the wafer (W) rotates and a discharge direction of the IPA is in a range of $0°<\theta<90°$. By supplying the IPA along the IPA flow lines 710 formed on the surface of the wafer (W), occurrence of mist at the liquid contact point (PA) can be suppressed and adhesion of mist to the dried wafer (W) can be suppressed.

It is not necessarily required that, as described using FIG. 4, the IPA nozzle 411 that supplies IPA and the N2 nozzle 431 that supplies an N2 gas are respectively provided in separate nozzle arms (41, 43) and are respectively moved in mutually opposite directions. For example, it is also possible that the IPA nozzle 411 and the N2 nozzle 431 are provided in a common first nozzle arm 41 and positioning of the nozzles (411, 431) are set such that a supply position of the N2 gas is positioned on a center portion side of a supply position of the IPA in the radial direction of the wafer (W).

It is not necessarily required to supply an N2 gas from the N2 nozzle 431. It is also possible that the drying of the wafer (W) is terminated by only an operation in which the IPA liquid film is swept away by moving the supply position of the IPA from the IPA nozzle 411.

In addition, in order to specify the flow rate (IPA center inflow rate) of the IPA flowing from the liquid contact point (PA) to the center portion side of the wafer (W), the method for determining the scan speed of the liquid contact point (PA) or the supply flow rate of the IPA from the IPA nozzle 411 is not limited to the case of using the above-described formula (1). For example, it is also possible that a fluid simulator is used to reproduce a flow state of IPA flowing on the surface of the wafer (W), and the scan speed of the liquid contact point (PA), or the IPA supply flow rate, is determined based on the simulation result.

In the examples described using FIG. 7A-7D and FIGS. 9A and 9B, in order for the distance (L) of the IPA flow lines 710 to be equal to or less than the upper limit distance (M), the scan speed of the liquid contact point (PA) or the IPA supply flow rate is controlled such that the IPA center inflow rate is equal to or less than s predetermined value, and further, the centrifugal acceleration acting on the IPA supplied to the liquid contact point (PA) is kept constant in order to suppress unstable drying of the center portion side IPA liquid film (711a) or IPA residues on the surface of the wafer (W).

On the other hand, even by independently keeping the centrifugal acceleration acting on the IPA supplied to the liquid contact point (PA) constant, occurrence of unstable drying of the center portion side IPA liquid film (711a) and the like can be suppressed as compared to the comparative embodiments.

That is, with respect to the cases where the IPA center inflow rate varies as illustrated in FIGS. 8A and 8B or in FIGS. 10A and 10B, it is also possible that the technology described in FIGS. 7C and 7D is applied so that the centrifugal acceleration acting on the IPA supplied to the liquid contact point (PA) is kept constant along the movement direction of the liquid contact point (PA).

In addition, a liquid that can be used as a drying liquid is not limited to IPA. Acetone, HFE (hydrofluoroether), HFO (methoxyperfluoroheptene), PFC (perfluorocarbon), HFC (hydrofluorocarbon) and the like can be adopted.

There is a technology that performs substrate processing by sequentially switching processing liquids such as a chemical liquid and a rinse liquid to supply the processing liquids to a surface of a rotating substrate (for example, a semiconductor wafer (hereinafter, referred to as a wafer)). When the processing using the various processing liquids is completed, a highly volatile drying liquid such as IPA (Isopropyl Alcohol) is supplied to the rotating substrate to replace the processing liquid remaining on the surface of the substrate with the drying liquid, and thereafter, the substrate is dried by discharging the drying liquid from the substrate.

However, along with advances in high integration and high aspect ratio of semiconductor devices, defects such as pattern collapse during drying have become more likely to occur.

A substrate processing apparatus, a substrate processing method, and a memory medium storing a method according to embodiments of the present invention allow a surface of a substrate to be dried using a drying liquid while suppressing occurrence of defects.

A substrate processing apparatus according to an embodiment of the present invention performs processing in which, after a processing liquid is supplied to a surface of a substrate, a drying liquid is supplied. The substrate processing apparatus includes: a substrate holding part that holds a substrate; a rotation mechanism that rotates the substrate held by the substrate holding part; a drying liquid supply nozzle that supplies a drying liquid for drying the substrate to the surface of the substrate, which is rotating, after the substrate has been subjected to processing using the processing liquid; a movement mechanism that relatively moves the substrate held by the substrate holding part and the drying liquid supply nozzle; a flow rate control mechanism that controls a supply flow rate of the drying liquid supplied from the drying liquid supply nozzle; and a controller that performs control such that, when a liquid contact point, which is a position at which the drying liquid supplied from the drying liquid supply nozzle reaches at the substrate, is moved from a center portion of the substrate toward an peripheral edge portion of the substrate, in drying liquid flow lines formed with the liquid contact point as a base point, a distance (L) from a center of the liquid contact point to an edge of the drying liquid flow lines on a rotation center side of the substrate is equal to or less than a preset upper limit distance (M).

The substrate processing apparatus may also have the following structures.

(a) The upper limit distance (M) is a value at which, when the drying liquid is supplied to form flow lines for which the distance (L) is equal to or less than the upper limit distance (M), an increase in a number of defects formed in a pattern formed on the surface of the substrate from a reference value is 5 or less per 1 cm$^2$. The controller performs control by varying a supply flow rate drying liquid or by varying a moving speed of the drying liquid supply nozzle such that the distance (L) is equal to or less than the upper limit distance (M).

(b) The controller controls the distance (L) based on a drying liquid inflow rate to a center portion side of the substrate from a unit section of an orbit circle drawn by the liquid contact point. In this case, the drying liquid inflow rate to the center portion side of the substrate is determined based on the following formula:

$$\text{drying liquid inflow rate} = \{(Q/2)*t\}/C \text{ (where } t=D/v)$$

Here D is an opening diameter (mm) of the drying liquid supply nozzle; Q is the drying liquid supply flow rate (ml/s); v is the moving speed (mm/s) of the liquid contact point; and C is a perimeter (mm) of the orbit circle drawn by the liquid contact point.

(c) The controller performs control that varies a rotation speed of the substrate by the rotation mechanism such that centrifugal acceleration acting on the drying liquid at the liquid contact point is constant along a movement direction of the liquid contact point.

(d) The drying liquid supply nozzle is positioned in a state in which a drying liquid discharge direction is inclined such that, as viewed from a rotation center of the substrate, the liquid contact point is positioned on a peripheral edge portion side of a drying liquid discharge position. Further, the drying liquid supply nozzle is positioned such that, in a plan view of the substrate, with respect to an orbit circle drawn by the liquid contact point, an angle (θ) formed by an tangential direction extending along a direction in which the substrate rotates and the drying liquid discharge direction is in a range of 0°<θ<90°.

A substrate processing apparatus according to another embodiment of the present invention performs processing in which, after a processing liquid is supplied to a surface of a substrate, a drying liquid is supplied. The substrate processing apparatus includes: a substrate holding part that holds a substrate; a rotation mechanism that rotates the substrate held by the substrate holding part; a drying liquid supply nozzle that supplies a drying liquid for drying the substrate to the surface of the substrate, which is rotating, after the substrate has been subjected to processing using the processing liquid; a movement mechanism that relatively moves the substrate held by the substrate holding part and the drying liquid supply nozzle; and a controller that performs control to vary a rotation speed of the substrate by the rotation mechanism such that, when a liquid contact point, which is a position at which the drying liquid supplied from the drying liquid supply nozzle reaches at the substrate, is moved from a center portion of the substrate toward a peripheral edge portion of the substrate, a centrifugal acceleration acting on the drying liquid at the liquid contact point is constant along a movement direction of the liquid contact point.

An embodiment of the present invention allows the surface of the substrate to be dried using the drying liquid while suppressing occurrence of defects.

Obviously, numerous modifications and variations of the present invention are possible in light of the above teachings. It is therefore to be understood that within the scope of the appended claims, the invention may be practiced otherwise than as specifically described herein.

The invention claimed is:

1. A substrate processing method, comprising:
supplying a drying liquid to a surface of a substrate rotating after processed with a processing liquid such that the processing liquid is removed and the substrate is dried,
wherein the supplying of the drying liquid includes moving a liquid contact point from a center portion of the substrate toward a peripheral edge portion of the substrate, and setting a distance L of a drying liquid flow line equal to or less than a preset upper limit distance M, where the liquid contact point is a position at which the drying liquid discharged from a drying liquid supply nozzle reaches the substrate, the drying liquid flow line is formed when the liquid contact point is moved from the center portion of the substrate toward the peripheral edge portion of the substrate, and the distance L of the drying liquid flow line is measured from a center of the liquid contact point to an edge of the drying liquid flow line on a rotation center side of the substrate.

2. The substrate processing method of claim 1, wherein the upper limit distance M is a value set such that an increase in a number of defects formed in a pattern formed on the surface of the substrate is 5 or less per 1 cm$^2$ with respect to a reference value of defects, when the drying liquid is supplied to form the drying liquid flow line having the distance L of equal to or less than the upper limit distance M.

3. The substrate processing method of claim 1, wherein the setting of the distance L comprises varying a supply flow rate of the drying liquid such that the distance L becomes equal to or less than the upper limit distance M.

4. The substrate processing method of claim 1, wherein the setting of the distance L comprises varying a moving speed of the liquid contact point of the drying liquid such that the distance L becomes equal to or less than the upper limit distance M.

5. A substrate processing apparatus, comprising:
a substrate holding device configured to hold a substrate;
a rotation mechanism configured to rotate the substrate held by the substrate holding device;
a drying liquid supply nozzle configured to supply a drying liquid that dries the substrate to a surface of the substrate rotating after processed with a processing liquid;
a movement mechanism configured to move the substrate held by the substrate holding device and the drying liquid supply nozzle relative to each other;
a flow rate control mechanism configured to control a supply flow rate of the drying liquid supplied from the drying liquid supply nozzle; and
a control device comprising circuitry configured to control at least one of the rotation mechanism, the movement mechanism and the flow rate control mechanism such that the drying liquid forms a drying liquid flow line having a distance L equal to or less than a preset upper limit distance M, where when a liquid contact point is a position at which the drying liquid discharged from the drying liquid supply nozzle reaches the substrate, the drying liquid flow line is formed when the liquid contact point is moved from a center portion of the substrate toward an peripheral edge portion of the substrate, and the distance L of the drying liquid flow line is measured from a center of the liquid contact point to an edge of the drying liquid flow line on a rotation center side of the substrate.

6. The substrate processing apparatus of claim 5, wherein the upper limit distance M is a value set such that an increase in a number of defects formed in a pattern formed on the surface of the substrate is 5 or less per 1 cm$^2$ with respect to a reference value of defects, when the drying liquid is supplied to form the drying liquid flow line having the distance L of equal to or less than the upper limit distance M.

7. The substrate processing apparatus of claim 5, wherein the circuitry of the control device is configured to control the flow rate control mechanism such that the supply flow rate of the drying liquid is varied and that the distance L becomes equal to or less than the upper limit distance M.

8. The substrate processing apparatus of claim 5, wherein the circuitry of the control device is configured to vary a moving speed of the drying liquid supply nozzle such that the distance L becomes equal to or less than the upper limit distance M.

9. The substrate processing apparatus of claim 5, wherein the circuitry of the control device is configured to control the distance L based on the drying liquid inflow rate to a center portion side of the substrate from a unit section of an orbit circle drawn by the liquid contact point.

10. The substrate processing apparatus of claim 9, wherein the circuitry of the control device is configured to determine the drying liquid inflow rate to the center portion side of the substrate based on a formula, drying liquid inflow rate=$\{(Q/2)*t\}/C$, with t=D/v, where D is an opening diameter of the drying liquid supply nozzle in mm, Q is the drying liquid supply flow rate in ml/s, v is a moving speed of the liquid contact point in min/s, and C is a perimeter of the orbit circle drawn by the liquid contact point in mm.

11. The substrate processing apparatus of claim 5, wherein the circuitry of the control device is configured to control the rotation mechanism such that the rotation mechanism varies a number of rotations per unit time for the substrate and that a centrifugal acceleration acting on the drying liquid at the liquid contact point becomes constant along a movement direction of the liquid contact point.

12. The substrate processing apparatus of claim 5, wherein the drying liquid supply nozzle is positioned and has a drying liquid discharge direction inclined such that the liquid contact point is positioned on more peripheral edge portion side than a drying liquid discharge position with respect to a rotation center of the substrate.

13. The substrate processing apparatus of claim 12, wherein the drying liquid supply nozzle is positioned such that an angle θ formed by an tangential direction extending along a direction in which the substrate rotates and the drying liquid discharge direction is set in a range of 0°<θ<90° with respect to an orbit circle drawn by the liquid contact point.

14. The substrate processing apparatus of claim 6, wherein the circuitry of the control device is configured to control the flow rate control mechanism such that the supply flow rate of the drying liquid is varied and that the distance L becomes equal to or less than the upper limit distance M.

15. The substrate processing apparatus of claim 6, wherein the circuitry of the control device is configured to vary a moving speed of the drying liquid supply nozzle such that the distance L becomes equal to or less than the upper limit distance M.

16. The substrate processing apparatus of claim 6, wherein the circuitry of the control device is configured to control the distance L based on the drying liquid inflow rate to a center portion side of the substrate from a unit section of an orbit circle drawn by the liquid contact point.

17. The substrate processing apparatus of claim 16, wherein the circuitry of the control device is configured to determine the drying liquid inflow rate to the center portion side of the substrate based on a formula, drying liquid inflow rate=$\{(Q/2)*t\}/C$, with $t=D/v$, where D is an opening diameter of the drying liquid supply nozzle in mm, Q is the drying liquid supply flow rate in ml/s, v is a moving speed of the liquid contact point in mm/s, and C is a perimeter of the orbit circle drawn by the liquid contact point in mm.

18. A non-transitory computer readable medium stored therein a program which, when executed by the circuitry of the control device in the substrate processing apparatus of claim 5, the circuitry of the control device executes the program comprising:
    instructing the drying liquid supply nozzle in the substrate processing apparatus of claim 1 such that the drying liquid supply nozzle supplies the drying liquid to the surface of the substrate rotating after processed with the processing liquid.

19. The substrate processing apparatus of claim 6, wherein the circuitry of the control device is configured to control the rotation mechanism such that the rotation mechanism varies a number of rotations per unit time for the substrate and that a centrifugal acceleration acting on the drying liquid at the liquid contact point becomes constant along a movement direction of the liquid contact point.

20. The substrate processing apparatus of claim 6, wherein the drying liquid supply nozzle is positioned and has a drying liquid discharge direction inclined such that the liquid contact point is positioned on more peripheral edge portion side than a drying liquid discharge position with respect to a rotation center of the substrate.

\* \* \* \* \*